(12) United States Patent
Liu et al.

(10) Patent No.: US 11,538,271 B2
(45) Date of Patent: Dec. 27, 2022

(54) DISPLAY PANEL, MANUFACTURING METHOD, AND DISPLAY DEVICE

(71) Applicant: BOE Technology Group Co., Ltd., Beijing (CN)

(72) Inventors: Ming Liu, Beijing (CN); Hongwei Tian, Beijing (CN); Hao Liu, Beijing (CN); Jing Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/460,012

(22) Filed: Aug. 27, 2021

(65) Prior Publication Data

US 2022/0156478 A1    May 19, 2022

(30) Foreign Application Priority Data

Nov. 13, 2020  (CN) .......................... 202011268161.0

(51) Int. Cl.
*G06V 40/13* (2022.01)
*H01L 27/146* (2006.01)

(52) U.S. Cl.
CPC .... *G06V 40/1318* (2022.01); *H01L 27/14678* (2013.01)

(58) Field of Classification Search
CPC ....................................................... G06F 3/042
See application file for complete search history.

(56) References Cited

U.S. PATENT DOCUMENTS

2021/0343972 A1* 11/2021 Zheng ................. H01L 27/3246
2021/0405813 A1* 12/2021 Li ......................... H01L 27/323

* cited by examiner

*Primary Examiner* — Joseph R Haley
(74) *Attorney, Agent, or Firm* — IPRO, PLLC

(57) ABSTRACT

The present disclosure provides a display panel, a manufacturing method thereof, and a display device. The display panel includes a plurality of optical fingerprint identification structures, each optical fingerprint identification structure includes a display region and a sensing region, the display region includes a driving circuitry layer, a planarization layer, a pixel definition layer, and a light-emitting element, and the light-emitting element includes an anode, a light-emitting material layer and a cathode. The sensing region includes a sensing region opening, an optical sensor and a cathode metal layer, the cathode metal layer includes a first cathode metal layer and a second cathode metal layer, and the first cathode metal layer is separated from the second cathode metal layer by a gap, so that light emitted by the light-emitting element is allowed to enter the optical sensor through the gap after being reflected by a fingerprint.

12 Claims, 7 Drawing Sheets

DISPLAY PANEL, MANUFACTURING METHOD, AND DISPLAY DEVICE

CROSS-REFERENCE TO RELATED APPLICATIONS

The present disclosure claims a priority of the Chinese patent application No. 202011268161.0 filed on Nov. 13, 2020, which is incorporated herein by reference in its entirety.

TECHNICAL FIELD

The present disclosure relates to the field of fingerprint identification technology, in particular to a display panel, a manufacturing method thereof, and a display device.

BACKGROUND

Fingerprint is inherent and unique for every one. With the development of the market, fingerprint identification technology has become one of the important functions of electronic products, which has been concerned by many electronic manufacturers and applied in their electronic products, such as mobile phones, tablet computers and intelligent wearable devices. In this way, the user only needs to touch a fingerprint identification module of the electronic product with a finger before operating the electronic product with a fingerprint identification function, so as to facilitate the permission validation.

At present, in the related art, an optical fingerprint identification technology is combined with a display technology, so that a fingerprint identification region is located in a display region. In this way, it is able to solve such a problem that a display panel is provided with a low screen-to-body ratio when the fingerprint identification region is arranged at a non-display region. However, in the related art, there is a serious loss of visible light for an optical fingerprint identification structure integrated in the display panel, and a utilization rate of the visible light is insufficient. At this time, the sensitivity of the optical fingerprint identification is relatively low, and usually it is impossible to identify the fingerprint normally, so the user experience is adversely affected.

SUMMARY

An object of the present disclosure is to provide a display panel, a manufacturing thereof, and a display device, so as to solve the problem in the related art where the sensitivity of the optical fingerprint identification is relatively low and it is usually impossible to identify the fingerprint normally due to a serious loss of visible light for an optical fingerprint identification structure integrated in the display panel, i.e., an insufficient utilization rate of visible light, thereby to improve the user experience.

In order to achieve the above object, the present disclosure provides the following technical solutions.

In a first aspect, the present disclosure provides in some embodiments a display panel, including a plurality of optical fingerprint identification structures arranged in an array form. Each optical fingerprint identification structure includes a display region and a sensing region, the display region includes a driving circuitry layer, a planarization layer, a pixel definition layer and a light-emitting element laminated one on another on a substrate, and the light-emitting element includes an anode, a light-emitting material layer and a cathode. The sensing region includes: a sensing region opening surrounded by the pixel definition layer, an orthogonal projection of the sensing region opening onto the substrate at least partially overlapping an orthogonal projection of the planarization layer onto the substrate; an optical sensor arranged between the sensing region opening and the substrate; and a cathode metal layer arranged in the sensing region opening. The cathode metal layer includes a first cathode metal layer and a second cathode metal layer, the first cathode metal layer extends to the pixel definition layer close to the display region, the first cathode metal layer is coupled to the cathode, the second cathode metal layer extends to the pixel definition layer away from the display region, and the first cathode metal layer is separated from the second cathode metal layer by a gap so that light emitted by the light-emitting element is allowed to enter the optical sensor through the gap after being reflected by a fingerprint.

In a possible embodiment of the present disclosure, the optical fingerprint identification structure further includes: an anode layer provided in the sensing region opening and including a first anode layer, a second anode layer and a third anode layer laminated one on another in a direction away from the substrate. The first anode layer is coupled to the first cathode metal layer, the second cathode metal layer extends to the third anode layer, and each of the first anode layer and the third anode layer protrudes from the second anode layer in a direction facing the display region so that the first cathode metal layer is separated from the second cathode metal layer at a side wall of the second anode layer facing the display region.

In a possible embodiment of the present disclosure, the anode is arranged at a same layer as the anode layer.

In a possible embodiment of the present disclosure, the anode includes a first anode, a second anode and a third anode laminated one on another, the first anode layer is arranged at a same layer as the first anode, the second anode layer is arranged at a same layer as the second anode, and the third anode layer is arranged at a same layer as the third anode.

In a possible embodiment of the present disclosure, the optical fingerprint identification structure further includes an auxiliary metal layer disposed in the sensing region opening. The auxiliary metal layer includes: a first auxiliary metal layer arranged between the first cathode metal layer and a side wall of the pixel definition layer close to the display region and extending to the pixel definition layer close to the display region; a second auxiliary metal layer arranged on the pixel definition layer away from the display region, the second cathode metal layer extending to the second auxiliary metal layer; and a third auxiliary metal layer arranged on a side wall of the pixel definition layer far away from the display region. The second auxiliary metal layer protrudes from the third auxiliary metal layer in a direction facing the display region so that the first cathode metal layer is separated from the second cathode metal layer at a side wall of the third auxiliary metal layer facing the display region.

In a possible embodiment of the present disclosure, the optical fingerprint identification structure further includes an auxiliary metal layer arranged in the sensing region opening. The auxiliary metal layer includes: a first auxiliary metal layer arranged between the first cathode metal layer and a side wall of the pixel definition layer close to the display region and extending to the pixel definition layer close to the display region; and a second auxiliary metal layer arranged on the pixel definition layer away from the display region, the second cathode metal layer extending to the second auxiliary metal layer. The second auxiliary metal layer protrudes from the side wall of the pixel definition layer away from the display region in a direction facing the display region so that the first cathode metal layer is separated from the second cathode metal layer at a side wall of the pixel definition layer away from the display region.

In a possible embodiment of the present disclosure, the cathode is arranged at a same layer as the cathode metal layer.

In a second aspect, the present disclosure provides in some embodiments a method for manufacturing a display panel, the display panel including a plurality of optical fingerprint identification structures arranged in an array form, the method including: forming a driving circuitry layer on a substrate; forming an optical sensor at a position corresponding to a sensing region of the optical fingerprint identification structure; forming a planarization layer on the driving circuitry layer; forming an anode on the planarization layer corresponding to a display region of the optical fingerprint identification structure, the anode being electrically coupled to the driving circuitry layer; forming a pixel definition layer; forming an opening in the pixel definition layer at a position corresponding to the display region to expose the anode, and forming an opening in the pixel definition layer at a position corresponding to the sensing region to form a sensing region opening for exposing the planarization layer; forming a light-emitting material layer on the anode; forming a cathode covering the display region on the light-emitting material layer, forming a cathode metal layer in the sensing region opening. The cathode metal layer includes a first cathode metal layer and a second cathode metal layer, the first cathode metal layer extends to the pixel definition layer close to the display region, the first cathode metal layer is coupled to the cathode, the second cathode metal layer extends to the pixel definition layer away from the display region, and the first cathode metal layer is separated from the second cathode metal layer by a gap so that the light emitted by the light-emitting element is allowed to enter the optical sensor through the gap after being reflected by a fingerprint.

In a possible embodiment of the present disclosure, when forming the anode on the planarization layer corresponding to the display region of the optical fingerprint identification structure, the method further includes forming an anode layer on the planarization layer at a position corresponding to the sensing region, the anode layer including a first anode layer, a second anode layer and a third anode layer laminated one on another. The forming the opening in the pixel definition layer at a position corresponding to the display region to expose the anode and forming the opening in the pixel definition layer at a position corresponding to the sensing region to form the sensing region opening for exposing the planarization layer includes removing the pixel definition layer at a surface of the anode layer away from the planarization layer to expose the surface of the anode layer away from the planarization layer, removing the pixel definition layer at a side surface of the anode layer close to the display region to expose the side surface of the anode layer close to the display region, and removing a part of the second anode layer such that each of the first anode layer and the third anode layer protrudes from the second anode layer in a direction facing the display region. The forming the cathode covering the display region on the light-emitting material layer and forming the cathode metal layer in the sensing region opening includes depositing a cathode material to form the cathode and the cathode metal layer.

In a possible embodiment of the present disclosure, prior to forming the opening in the pixel definition layer at a position corresponding to the display region to expose the anode and forming the opening in the pixel definition layer at a position corresponding to the sensing region to form the sensing region opening for exposing the planarization layer, the method further includes: forming a first opening and a second opening in the pixel definition layer surrounding the sensing region opening, both the first opening and the second opening extending through the pixel definition layer to expose the planarization layer, the first opening being formed in the pixel definition layer close to the display region, and the second opening being formed in the pixel definition layer away from the display region; and forming a first auxiliary metal layer in the first opening, and forming a third auxiliary metal layer in the second opening, the first auxiliary metal layer extending to the pixel definition layer close to the display region, and the third auxiliary metal layer extending to the pixel definition layer away from the display region to form a second auxiliary metal layer. The forming the opening in the pixel definition layer at a position corresponding to the display region to expose the anode and forming the opening in the pixel definition layer at a position corresponding to the sensing region to form the sensing region opening for exposing the planarization layer includes removing the pixel definition layer between the first auxiliary metal layer and the third auxiliary metal layer to expose the planarization layer, the second auxiliary metal layer protruding from the third auxiliary metal layer in a direction facing the display region. The forming the cathode covering the display region on the light-emitting material layer and forming the cathode metal layer in the sensing region opening includes depositing a cathode material to form the cathode and the cathode metal layer.

In a possible embodiment of the present disclosure, prior to forming the opening in the pixel definition layer at a position corresponding to the display region to expose the anode and forming the opening in the pixel definition layer at a position corresponding to the sensing region to form the sensing region opening for exposing the planarization layer, the method further includes: forming a first opening and a second opening in the pixel definition layer surrounding the sensing region opening, both the first opening and the second opening extending through the pixel definition layer to expose the planarization layer, the first opening being formed in the pixel definition layer close to the display region, and the second opening being formed in the pixel definition layer away from the display region; and forming a first auxiliary metal layer in the first opening, and forming a third auxiliary metal layer in the second opening, the first auxiliary metal layer extending to the pixel definition layer close to the display region, the first auxiliary metal layer being electrically coupled to the cathode, and the third auxiliary metal layer extending to the pixel definition layer away from the display region to form a second auxiliary metal layer. The forming the opening in the pixel definition layer at a position corresponding to the display region to expose the anode and forming the opening in the pixel definition layer at a position corresponding, to the sensing region to form the sensing region opening for exposing the planarization layer includes: removing the pixel definition layer between the first auxiliary metal layer and the third auxiliary metal layer to expose the planarization layer; and removing the third auxiliary metal layer, the second auxiliary metal layer protruding from the side wall of the pixel definition layer away from the display region in a direction facing the display region. The forming the cathode covering the display region on the light-emitting material layer and forming the cathode metal layer in the sensing region opening includes depositing a cathode material to form the cathode and the cathode metal layer.

In a third aspect, the present disclosure provides in some embodiments a display device including the above-mentioned display panel.

The present disclosure has the following advantageous effects.

According to the display panel, the manufacturing method thereof, and the display device in the embodiments of the present disclosure, visible light reflected by a finger directly enters the optical sensor without any necessity to pass through a semitransparent cathode, so it is able to reduce the loss of the visible light, increase the amount of the visible light entering the optical sensor, and improve a utilization rate of the visible light, thereby to improve the sensitivity of the optical fingerprint identification. In addition, the display panel is easily implemented and matches an existing process, so it is able to reduce the manufacture cost.

BRIEF DESCRIPTION OF THE DRAWINGS

The present disclosure will be described hereinafter in conjunction with the drawings.

DETAILED DESCRIPTION

Figure 1:
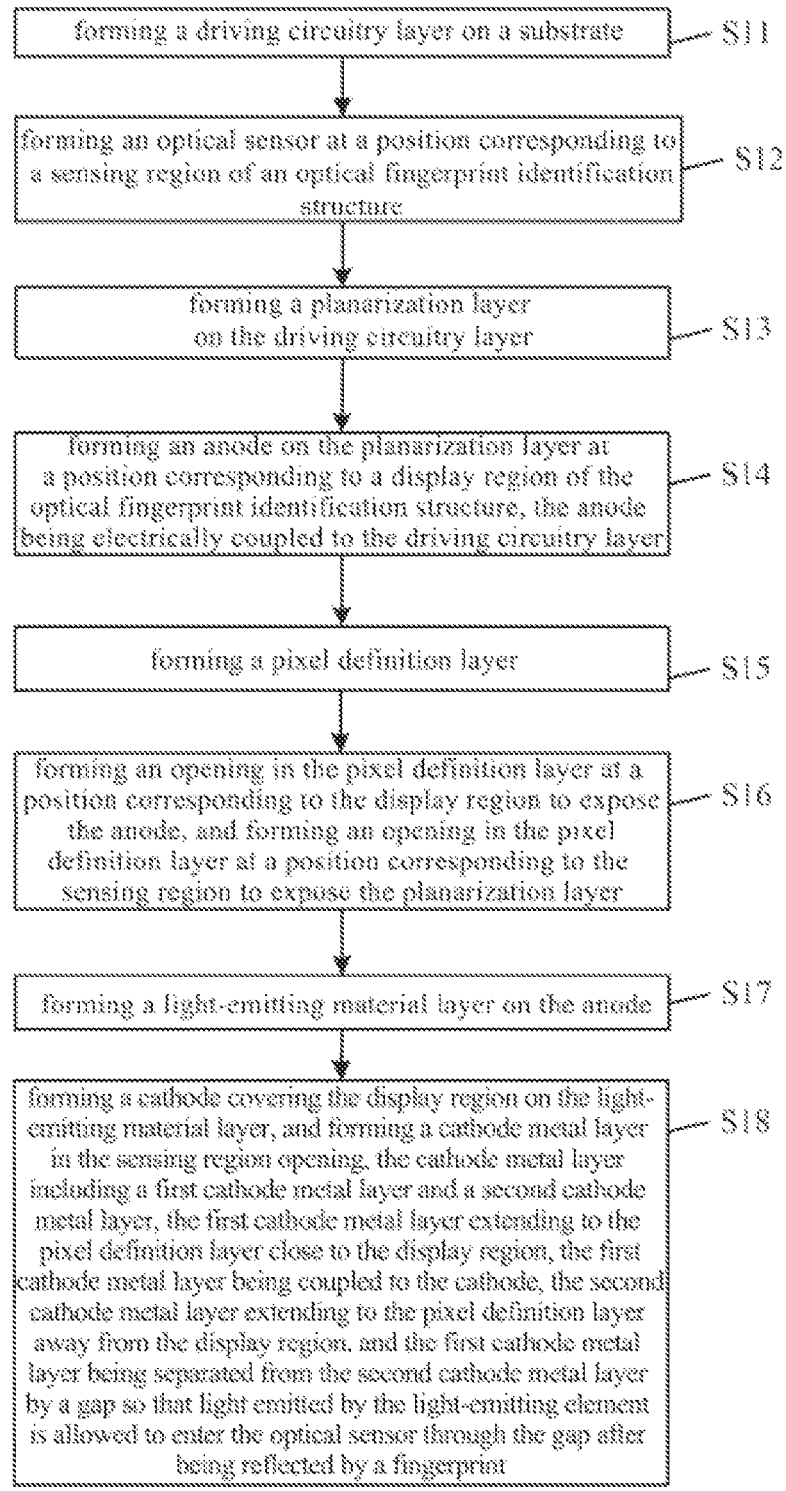
FIG. 1 is a flow chart of a method for manufacturing a display panel according to one embodiment of the present disclosure.

The present disclosure will be described hereinafter in conjunction with the embodiments and drawings. Any similar reference numeral in the drawings represents a similar element. It should be appreciated that, the following embodiments are for illustrative purposes only, but shall not be construed as limiting the application or use of the present disclosure.

It should be appreciated that, such words as "on" and "under" are used to indicate directions or positions as viewed in the drawings, and they are merely used to facilitate the description in the present disclosure, rather than to indicate or imply that a device or member must be arranged or operated at a specific position, Unless otherwise specified, such words as "arrange" and "connect" have a general meaning, e.g., the word "connect" may refer to fixed connection, removable connection or integral connection, or mechanical or electrical connection, or direct connection or indirect connection via an intermediate component, or communication between two components. The meanings of these words may be understood by a person skilled in the art in accordance with the practical need.

It should be further appreciated that, such words as "first" and "second" are merely used to separate one entity or operation from another entity or operation, but are not necessarily used to represent or imply any relation or order between the entities or operations. In addition, such terms as "include" or "including" or any other variations involved in the present disclosure intend to provide non-exclusive coverage, so that a procedure, method, article or device including a series of elements may also include any other elements not listed herein, or may include any inherent elements of the procedure, method, article or device. If without any further limitations, for the elements defined by such sentence as "including one . . . ", it is not excluded that the procedure, method, article or device including the elements may also include any other identical elements.

The present disclosure provides in some embodiments a method for manufacturing a display panel. The display panel includes a plurality of optical fingerprint identification structures arranged in an array form. As shown in FIGS. 1 to 6, the method includes the following steps.

S11: forming a driving circuitry layer 110 on a substrate 100.

Illustratively, the substrate 100 is a transparent substrate, for example, a rigid substrate (e.g. glass) or a flexible substrate. The driving circuitry layer 110 includes a Thin Film Transistor (TFT), a connection circuitry, etc.

S12: forming an optical sensor 120 at a position corresponding to a sensing region 40 of the optical fingerprint identification structure.

Illustratively, the optical fingerprint identification structure includes a display region 30 and the sensing region 40, and the optical sensor 120 is configured to receive visible light reflected by a finger for optical fingerprint identification.

Figure 2:
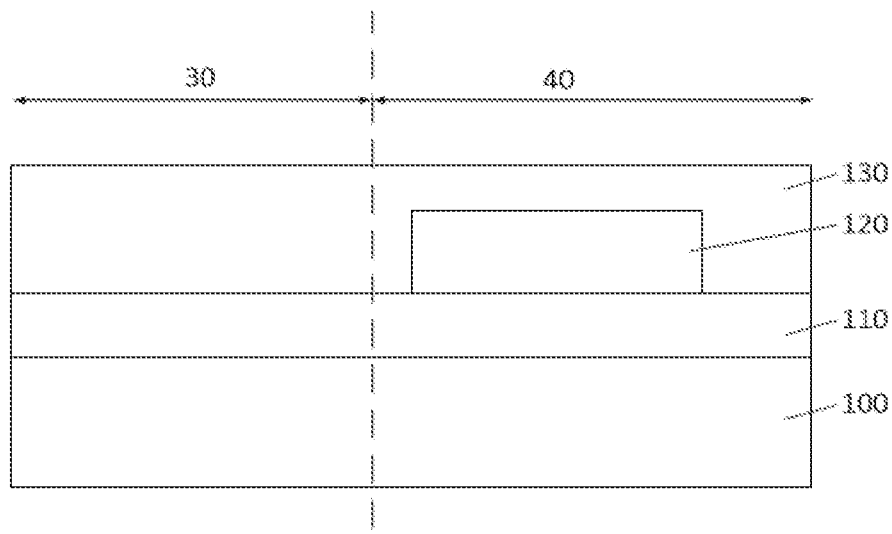
FIGS. 2 to 6 are schematic views showing the manufacture of the display panel according to one embodiment of the present disclosure.

S13: forming a planarization layer 130 on the driving circuitry layer 110 to form a structure as shown in FIG. 2.

Illustratively, the planarization layer 130 is configured to planarize the driving circuitry layer 110 and the optical sensor 120. In a possible embodiment of the present disclosure, the planarization layer 130 is made of a black material, such as light-shielding silicon oxide, silicon nitride, or an organic resin, so as not only to ensure that the visible light reflected by the finger is received by the optical sensor 120 through the planarization layer 130, but also to prevent the driving circuitry layer 110 from being adversely affected by stray light, thereby to improve the visibility and contrast of a display device. Illustratively, light having a wavelength of 380 nm to 770 nm is capable of being shielded, and the stray light includes ambient visible light or reflected light of the visible light.

Figure 3:
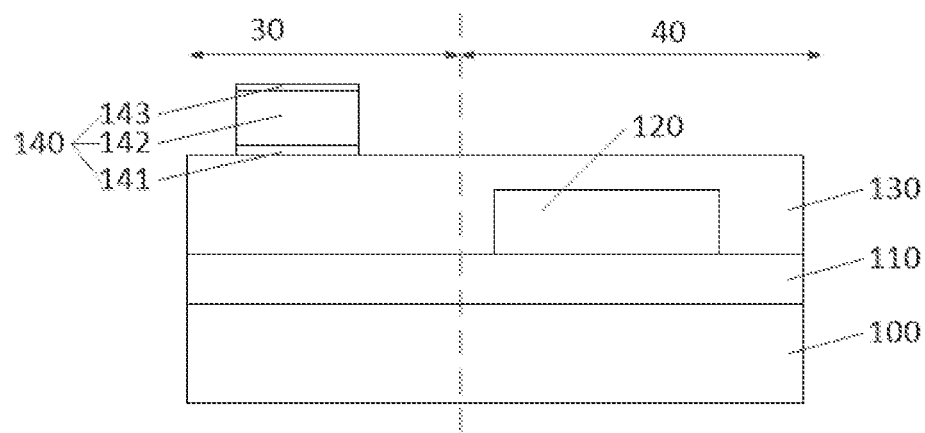

S14: forming an anode 140 on the planarization layer 130 at a position corresponding to the display region 30 of the optical fingerprint identification structure. The anode 140 is electrically coupled to the driving circuitry layer 110 so as to form a structure as shown in FIG. 3.

Illustratively, a via-hole is formed in the planarization layer 130 to expose the driving circuitry layer 110, and then the anode 140 is formed on the exposed driving circuitry layer 110 through a single patterning process. In a possible embodiment of the present disclosure, as shown in FIG. 3, the anode 140 includes a first anode 141, a second anode 142, and a third anode 143 laminated one on another. To be specific, the first anode 141 is an Indium Tin Oxide (ITO) layer, the second anode 142 is an argentum (Ag) layer, and the third anode is an ITO layer.

Figure 4:
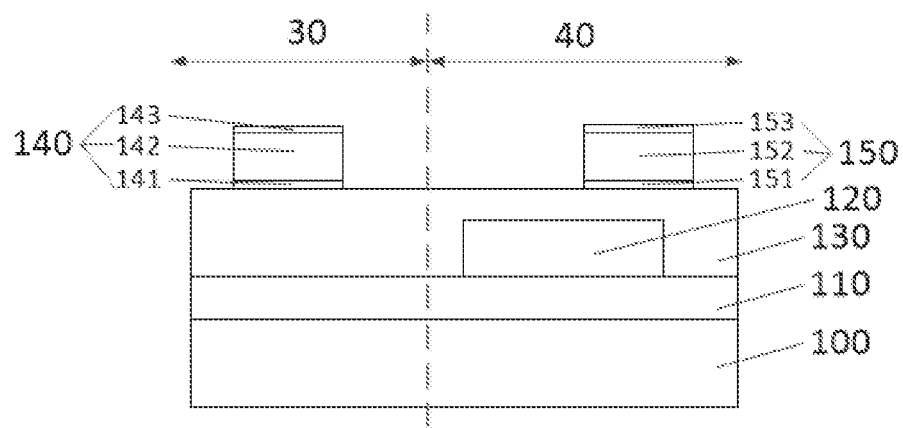

In a possible embodiment of the present disclosure, when the anode 140 electrically coupled to the driving circuitry layer 110 is formed on the planarization layer 130 at a position corresponding to the display region 30 of the optical fingerprint identification structure, the method further includes S141 of forming an anode layer 150 on the planarization layer 130 at a position corresponding to the sensing region 40. The anode layer 150 includes a first anode layer 151, a second anode layer 152 and a third anode layer 153 laminated one on another to form a structure as shown in FIG. 4.

In a possible embodiment of the present disclosure, the anode 140 and the anode layer 50 are arranged at a same layer. When the anode 140 includes the first anode 141, the second anode 142 and the third anode 143 laminated one on another, the first anode layer 151 is arranged at a same layer as the first anode 141, the second anode layer 152 is arranged at a same layer as the second anode 142, and the third anode layer 153 is arranged at a same layer as the third anode 143. Materials of the first anode 141, the second anode 142 and the third anode 143 of the anode 140 are the same as materials of the first anode layer 151, the second anode layer 152 and the third anode layer 153 of the anode layer 150 respectively. For example, the second anode 142 is made of a same material, e.g., Ag, as the second anode layer 152 of the anode layer 150, and Ag has reflectivity of more than 90% to the visible light. The first anode 141 is made of a same material, e.g., ITO, as the first anode layer 151 of the anode layer 150.

It should be appreciated that, when two layers are arranged at a same layer, it means that the two are formed through a single process. For example, through a single process, the first anode layer 151 is formed on the planarization layer 130 at a position corresponding to the sensing region 40, and the first anode 141 is formed on the planarization layer 130 at a position corresponding to the display region 30. The anode 140 and the anode layer 150 are located at a same level as shown in FIG. 4, or located at different levels.

The anode 140 and the anode layer 150 are arranged at a same layer and formed through a single process, so as to match an existing manufacture process in a better manner, and simplify the formation of the anode layer 150, thereby to improve the tact time of the optical fingerprint identification structure and reduce the manufacture cost.

S15: forming a pixel definition layer 160.

Illustratively, the pixel definition layer 160 is configured to define pixel aperture regions, and each pixel aperture region corresponds to one anode 14. An orthogonal projection of the pixel aperture region onto the substrate 100 at least partially overlaps an orthogonal projection of the corresponding anode 140 onto the substrate 100, The pixel definition layer 160 is made of, but not limited to, silicone, silicon nitride, barium sulfate, alumina, magnesium oxide, polyimide, epoxy resin, polyphenylene oxide.

S16: forming an opening in the pixel definition layer 160 at a position corresponding to the display region 30 to expose the anode 40, and forming an opening in the pixel definition layer 160 at a position corresponding to the sensing region 40 to expose the planarization layer 130.

Figure 5:
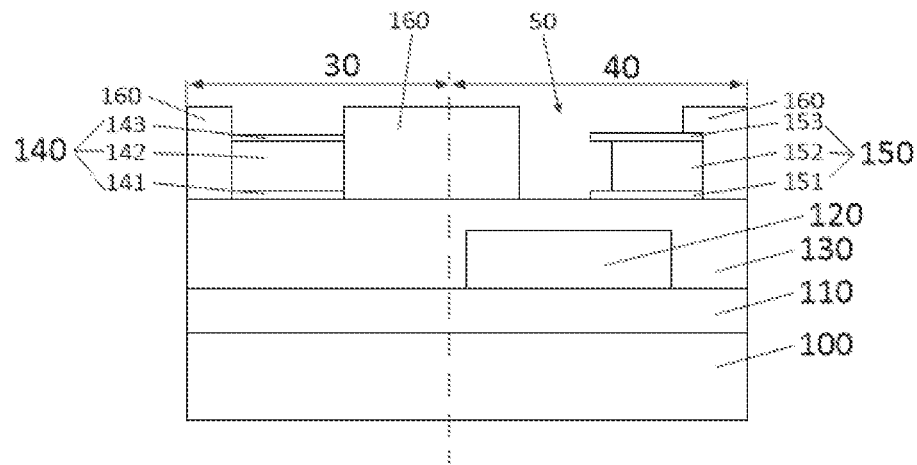

In a possible embodiment of the present disclosure, S16 includes S161 of removing the pixel definition layer 160 at a surface of the anode layer 150 away from the planarization layer 130 to expose the surface of the anode layer 150 away from the planarization layer 130, removing the pixel definition layer 160 at a side surface of the anode layer 150 close to the display region 30 to expose the side surface of the anode layer 150 close to the display region 30 (i.e., expose side surfaces of the first anode layer 151, the second anode layer 152 and the third anode layer 153), and removing a part of the second anode layer 152 through a selective etching process (such as wet etching), so that each of the first anode layer 151 and the third anode layer 153 protrudes from the second anode layer 152 in a direction facing the display region to form a structure where the second anode layer 152 is contracted as shown in FIG. 5.

Through the contracted structure of the second anode layer 152 as shown in FIG. 5, it is able for a cathode metal layer 170 to be interrupted at a side surface of the second anode layer 152 to form a first cathode metal layer 171 and a second cathode metal layer 172.

S17: forming a light-emitting material layer 180 on the anode 140.

Figure 6:
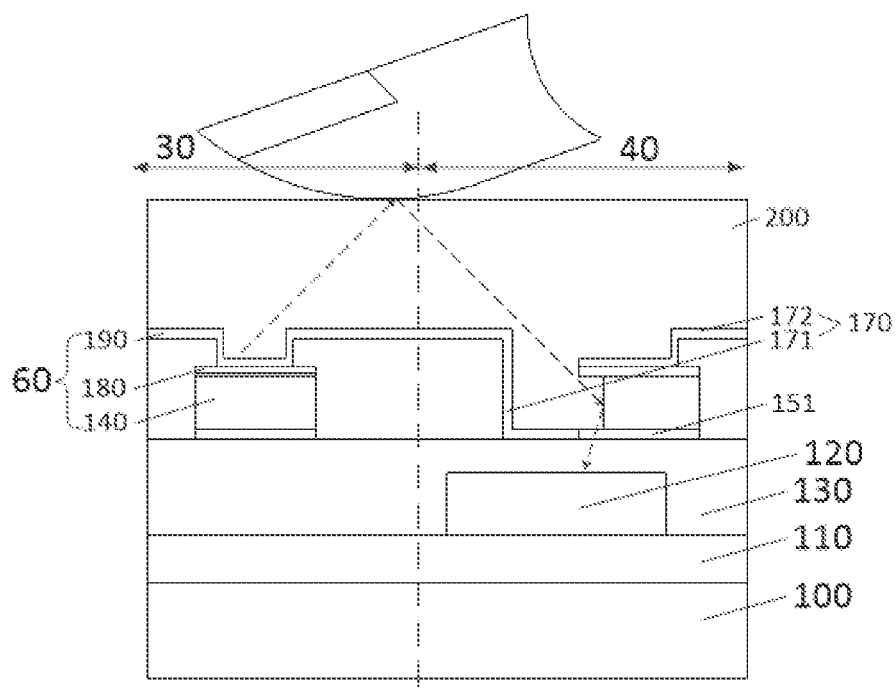

S18: as shown in FIGS. 5 and 6, forming a cathode 190 covering the display region 30 on the light-emitting material layer 180, and forming the cathode metal layer 170 in the sensing region opening 50. The cathode metal layer 170 includes the first cathode metal layer 171 and the second cathode metal layer 172, the first cathode metal layer 171 extends to the pixel definition layer 160 close to the display region 30, and the first cathode metal layer 171 is coupled to the cathode 190. The second cathode metal layer 172 extends to the pixel definition layer 160 away from the display region 30. The first cathode metal layer 171 is separated from the second cathode metal layer 172 by a gap so that light emitted by the light-emitting element is allowed to enter the optical sensor 120 through the gap after being reflected by a fingerprint.

As shown in FIGS. 5 and 6, in a possible embodiment of the present disclosure, the cathode 190 covering the display region 30 is formed on the light-emitting material layer 180. The forming the cathode metal layer 170 in the sensing region opening 50 includes S181 of depositing a cathode material to form the cathode 190 and the cathode metal layer 150. Then, an encapsulation layer 200 is formed on the cathode 190 and the cathode metal layer 170, to finally acquire the display panel as shown in FIG. 6.

As shown in FIGS. 5 and 6, there is a space between the pixel definition layer 160 close to the display region 30 and the pixel definition layer 160 away from the display region 30, and the visible light is reflected by the finger to the optical sensor 120 through the space. In addition, the third anode layer 153 is located outside the second anode layer 152, and the third anode layer 153 is coupled to the first cathode metal layer 171, i.e., there is a certain distance between the first cathode metal layer 171 and the second anode layer 152. Hence, the visible light reflected by the finger is merely reflected by the second anode layer 152 (e.g., an Ag material having reflectivity of more than 90% to the visible light) to the optical sensor 120 through the first anode layer 151 (e.g., ITO), without any necessity to pass through the semitransparent cathode 190.

In a possible embodiment of the present disclosure, the cathode 190 is arranged at a same layer as the cathode metal layer 170, i.e., the cathode 190 and the cathode metal layer 170 are formed through a single process.

According to the embodiments of the present disclosure, the visible light reflected by the finger is directly reflected by the second anode layer 152 at the gap, rather than the semitransparent cathode, toward the optical sensor 120. As compared with a situation where the light is reflected by the cathode 190 (which has reflectivity of about 50% to the visible light), the reflectivity of the second anode layer 152 to the visible light is more than 90%. As a result, it is able to effectively reduce the loss of the visible light and increase the amount of the visible light received by the optical sensor 120, thereby to increase a utilization rate of the visible light and improve the sensitivity of the optical fingerprint identification. In addition, the method is easily implemented, and a manufacture process matches an existing process, so it is able to reduce the manufacture cost.

The present disclosure further provides in some embodiments a display panel which, as shown in FIGS. 5 and 6, includes a plurality of optical fingerprint identification structures arranged in an array form. Each optical fingerprint identification structure includes a display region 30 and a sensing region 40. The display region 30 includes a driving circuitry layer 110, a planarization layer 130, a pixel definition layer 160 and a light-emitting element 60 laminated one on another on a substrate 100, and the light-emitting element 60 includes an anode 140, a light-emitting material layer 180 and a cathode 190. The sensing region 40 includes: a sensing region opening 50 surrounded by a pixel definition layer 160, an orthogonal projection of the sensing region opening 50 onto the substrate 100 at least partially overlapping an orthogonal projection of the planarization layer 130 onto the substrate 100; an optical sensor 120 arranged between the sensing region opening 50 and the substrate; and a cathode metal layer 170 arranged in the sensing region opening 50. The cathode metal layer 170 includes a first cathode metal layer 171 and a second cathode metal layer 172, the first cathode metal layer 171 extends to the pixel definition layer 160 close to the display region 30, and the first cathode metal layer 171 is coupled to the cathode 190. The second cathode metal layer 172 extends to the pixel definition layer 160 away from the display region 30. The first cathode metal layer 171 is separated from the second cathode metal layer 172 by a gap, so that light emitted by the light-emitting element is allowed to enter the optical sensor 120 through the gap after being reflected by a fingerprint.

The optical fingerprint identification structure further includes an anode layer 150 arranged in the sensing region opening 50. The anode layer 150 includes a first anode layer 151, a second anode layer 152 and a third anode layer 153 laminated one on another in a direction away from the substrate. The first anode layer 151 is coupled to the first cathode metal layer 171, the second cathode metal layer 172 extends to the third anode layer 153, and each of the first anode layer 151 and the third anode layer 153 protrudes from the second anode layer 152 in a direction facing the display region 30, so that the first cathode metal layer 171 is separated from the second cathode metal layer 172 by a gap at a side wall of the second anode layer 152 facing the display region 30. At this time, the light emitted by the light-emitting element 60 is allowed to enter the optical sensor 120 through the gap after being reflected by the finger.

Referring to FIGS. 7 to 12, the present disclosure provides a method for manufacturing a display panel. The display panel includes a plurality of optical fingerprint identification structures arranged in an array form. The method includes the following steps.

S21: forming the driving circuitry layer 110 on the substrate 100.

S22: forming the optical sensor 120 at a position corresponding to the sensing region 40 of the optical fingerprint identification structure. The optical fingerprint identification structure includes the display region 30 and the sensing region 40, and the optical sensor 120 is configured to receive the visible light reflected by the finger for the optical fingerprint identification.

Figure 7:
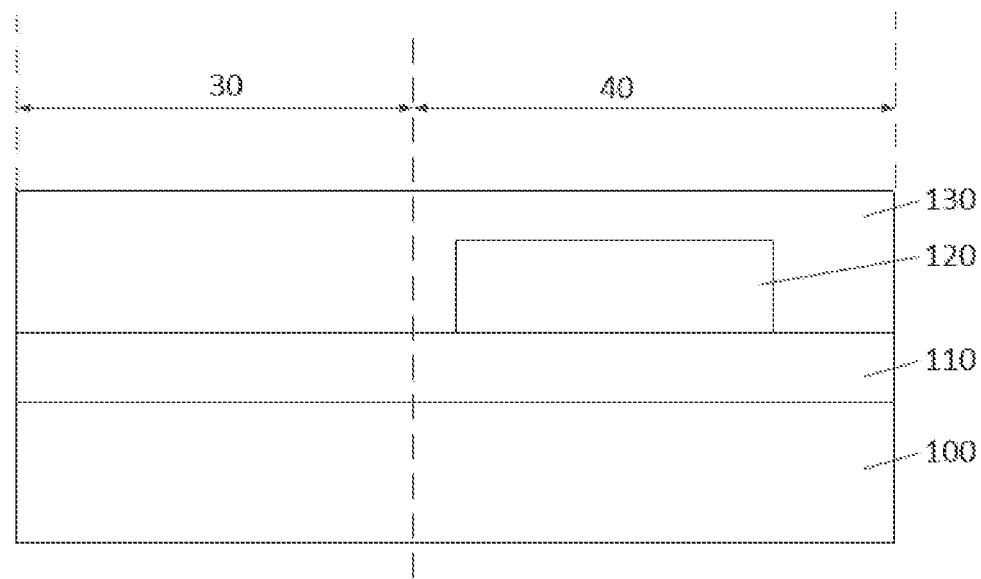
FIGS. 7 to 12 are schematic views showing the manufacture of the display panel according to one embodiment of the present disclosure.

S23: forming the planarization layer 130 on the driving circuitry layer 110 to form a structure as shown in FIG. 7.

S24: forming the anode 140 on the planarization layer 130 at a position corresponding to the display region 30 of the optical fingerprint identification structure. The anode 140 is electrically coupled to the driving circuitry layer 110.

Figure 8:
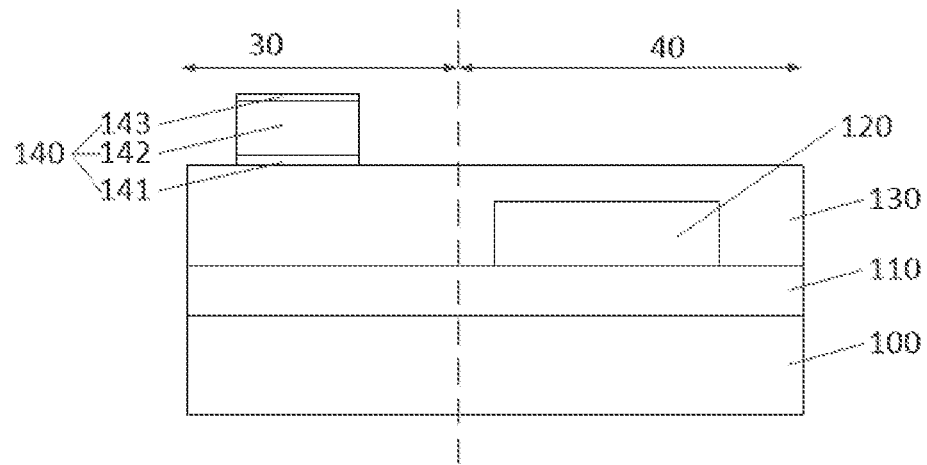

In a possible embodiment of the present disclosure, as shown in FIG. 8, the anode 140 includes the first anode 141, the second anode 142, and the third anode 143 laminated one on another.

S25: forming the pixel definition layer 160.

In the embodiments of the present disclosure, subsequent to S25, the method further includes the following steps.

Figure 9:
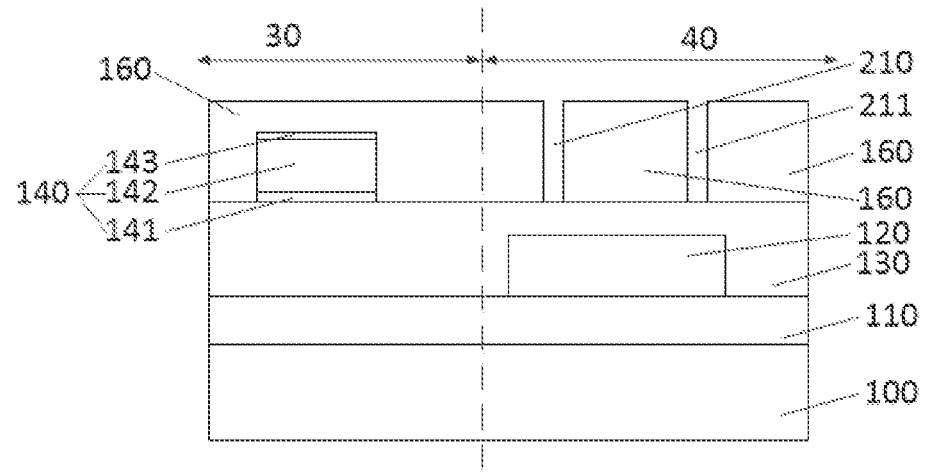

S251: forming a first opening 210 and a second opening 211 in the pixel definition layer 160 surrounding the sensing region opening 50. The first opening 210 and the second opening 211 penetrate through the pixel definition layer 160 to expose the planarization layer 130, so as to form a structure as shown in FIG. 9. The first opening 210 is formed in the pixel definition layer 160 close to the display region 30, and the second opening 211 is formed in the pixel definition layer 160 away from the display region 30.

Figure 10:
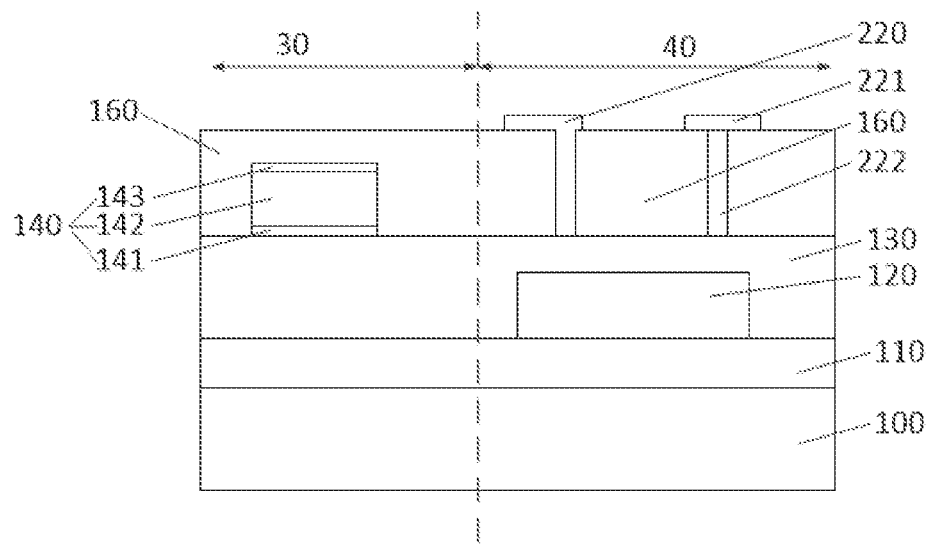

S252: forming a first auxiliary metal layer 220 in the first opening 210, and forming a third auxiliary metal layer 222 in the second opening 211. The first auxiliary metal layer 220 extends to the pixel definition layer 160 close to the display region 30, and the third auxiliary metal layer 222 extends to the pixel definition layer 160 away from the display region 30, so as to form a structure as shown in FIG. 10. At this time, the first auxiliary metal layer 220 has a T-shaped structure, and the second auxiliary metal layer 221 and the third auxiliary metal layer 222, as a whole, have a T-shaped structure.

In a possible embodiment of the present disclosure, the first auxiliary metal layer 220, the second auxiliary metal layer 221 and the third auxiliary metal layer 222 are each made of a metal with high reflectivity, e.g., Mo, Al, etc.

S26: forming an opening in the pixel definition layer 160 at a position corresponding to the display region 30 to expose the anode 140, and forming an opening in the pixel definition layer 160 at a position corresponding to the sensing region 40 to form a sensing region opening 50 for exposing the planarization layer 130.

Figure 11:
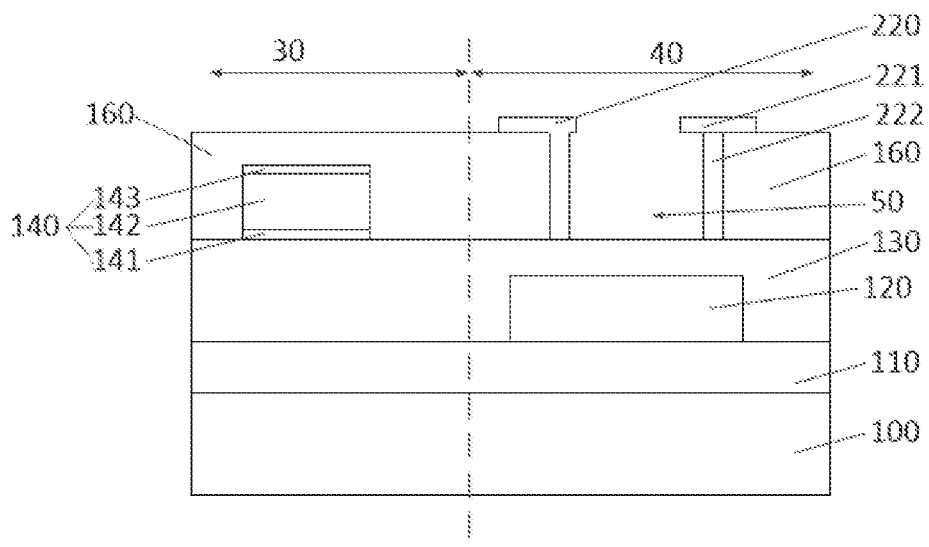

In the embodiments of the present disclosure, S26 includes S261 of removing the pixel definition layer 160 between the first auxiliary metal layer 220 and the third auxiliary metal layer 222 to expose the planarization layer 130. The second auxiliary metal layer 221 protrudes in a direction facing the display region 30 relative to the third auxiliary metal layer 222, so as to form a structure as shown in FIG. 11.

In a possible embodiment of the present disclosure, the pixel definition layer 160 between the first auxiliary metal layer 220 and the third auxiliary metal layer 222 is removed through an etching process or an asking process, so as to expose side surfaces of the first auxiliary metal layer 220 and the third auxiliary metal layer 222.

In addition, a width of the first auxiliary metal layer 220 on the pixel definition layer 160 close to the display region 30 is different from a width of the second auxiliary metal layer 221 on the pixel definition layer 160 away from the display region 30.

In a possible embodiment of the present disclosure, the width of the first auxiliary metal layer 220 on the pixel definition layer 160 close to the display region 30 is smaller than the width of the second auxiliary metal layer 221 on the pixel definition layer 160 away from the display region 30, so as to prevent the formation of the cathode metal layer 170 from being adversely affected by the first auxiliary metal layer 220, thereby to ensure the continuity of the first cathode metal layer 171 during the formation of the cathode metal layer 170, and prevent the first cathode metal layer 171 from being interrupted. Meanwhile, the first cathode metal layer 171 is coupled to the side wall of the first auxiliary metal layer 220, and the first auxiliary metal layer 220 also serves as an auxiliary cathode of the cathode 190, so as to reduce a resistance of the cathode and increase the amount of the visible light from the light-emitting element 60, thereby to enable the sufficient visible light reflected by the finger to enter the optical sensor 120. The width of the second auxiliary metal layer 221 on the pixel definition) 160 away from the display region is relatively large, i.e., an end of the second auxiliary metal layer 221 close to the display region is spaced apart from the third auxiliary metal layer 222 by a large distance, so it is able for the cathode metal layer 170 to be interrupted at a position corresponding to the end of the second auxiliary metal layer 221 close to the display region 30 during the subsequent formation of the cathode metal layer 170.

S27: forming the light-emitting material layer 180 on the anode 140.

S28: forming the cathode 190 covering the display region 30 on the light-emitting material layer 180, and forming the cathode metal layer 170 in the sensing region opening 50. The cathode metal layer 170 includes the first cathode metal layer 171 and the second cathode metal layer 172, the first cathode metal layer 171 extends to the pixel definition layer 160 close to the display region 30 and is coupled to the cathode 190, the second cathode metal layer 172 extends to the pixel definition layer 160 away from the display region 30, and the first cathode metal layer 171 is separated from the second cathode metal layer 172 by the gap so that the light emitted by the light-emitting element 60 is allowed to enter the optical sensor 120 through the gap after being reflected by the fingerprint.

In the embodiments of the present disclosure, s28 includes S281 of depositing a cathode material to form the cathode 190 and the cathode metal layer 170. Then, the encapsulation layer 200 is formed on the cathode 190 and the cathode metal layer 170, so as to finally acquire a structure as shown in FIG. 12.

After the formation of the cathode metal layer 170, due to the large width of the second auxiliary metal layer 221 on the pixel definition layer 160 away from the display region 30, a gap is provided between an end of the first cathode metal layer 171 away from the display region 30 and a bottom end of the third auxiliary metal layer 222, and there is a clearance sufficient for the light to pass therethrough between an end of the second cathode metal layer 172 close to the display region 30 and the end of the first cathode metal layer 171 away from the display region 30. Hence, the visible light reflected by the finger is capable of being reflected by the third auxiliary metal layer 222 through the clearance between the first cathode metal layer 171 and the second cathode metal layer 172 and toward the optical sensor 120 through the gap.

According to the embodiments of the present disclosure, the visible light reflected by the finger is reflected by the third auxiliary metal layer 222, rather than the semitransparent cathode 190, toward the optical sensor 120, so it is able to reduce the loss of the visible light, and increase a utilization rate of the visible light as well as the amount of the light received by the optical sensor 120, thereby to improve the sensitivity of the optical fingerprint identification. In addition, the first auxiliary metal layer 220 also serves as an auxiliary cathode of the cathode 190, and it is able to reduce a resistance of the cathode 190, and increase the amount of the visible light from the light-emitting element 120, thereby to allow sufficient visible light to enter the optical sensor 120.

Figure 12:
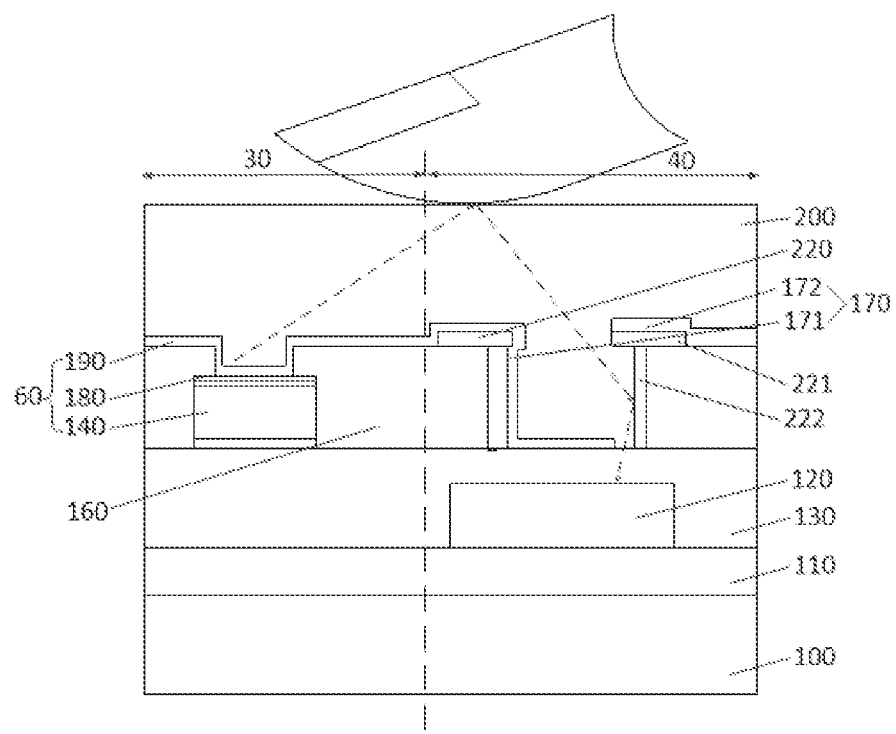

The present disclosure further provides in some embodiments a display panel which, as shown in FIG. 12, includes a plurality of optical fingerprint identification structures arranged in an array form. Each optical fingerprint identification structure includes the display region 30 and the sensing region 40. The display region 30 includes the driving circuitry layer 110, the planarization layer 130, the pixel definition layer 160 and the light-emitting element 60 laminated one on another on the substrate 100. The light-emitting element 60 includes the anode 140, the light-emitting material layer 180 and the cathode 190. The sensing region 40 includes: the sensing region opening 50 surrounded by the pixel definition layer 160 to expose the planarization layer 130; the optical sensor device 120 arranged below the sensing region opening 50; the cathode metal layer 170 formed in the sensing region opening 50. The cathode metal layer 170 includes a first cathode metal layer 171 and a second cathode metal layer 172, the first cathode metal layer 171 extends to the pixel definition layer 160 close to the display region 30, the first cathode metal layer 171 is coupled to the cathode 190, and the second cathode metal layer 172 extends to the pixel definition layer 160 away from the display region 30.

The optical fingerprint identification structure further includes an auxiliary metal layer arranged in the sensing region opening 50 and including a first auxiliary metal layer 220. The first auxiliary metal layer 220 is located between the first cathode metal layer 171 and a side wall of the pixel definition layer 160 close to the display region 30, and extends to the pixel definition layer 160 close to the display region 30. The auxiliary metal layer further includes a second auxiliary metal layer 221 located on the pixel definition layer 160 away from the display region 30, and the second cathode metal layer 172 extends to the second auxiliary metal layer 221. The auxiliary metal layer further includes a third auxiliary metal layer 222 located on a side wall of the pixel definition layer 160 away from the display region 30. The second auxiliary metal layer 221 protrudes from the third auxiliary metal layer 213 in a direction facing the display region 30 such that the first cathode metal layer 171 is separated from the second cathode metal layer 172 by a gap at a side wall of the third auxiliary metal layer 222 facing the display region.

During the formation of the cathode metal layer 170, a cathode metal layer material easily overflows, so that the first cathode metal layer 171 is probably attached to the third auxiliary metal layer 222. At this time, the visible light reflected by the third auxiliary metal layer 222 must be reflected by the cathode 190 toward the optical sensor 120, so the amount of the visible light received by the optical sensor 120 is reduced.

Figure 13:
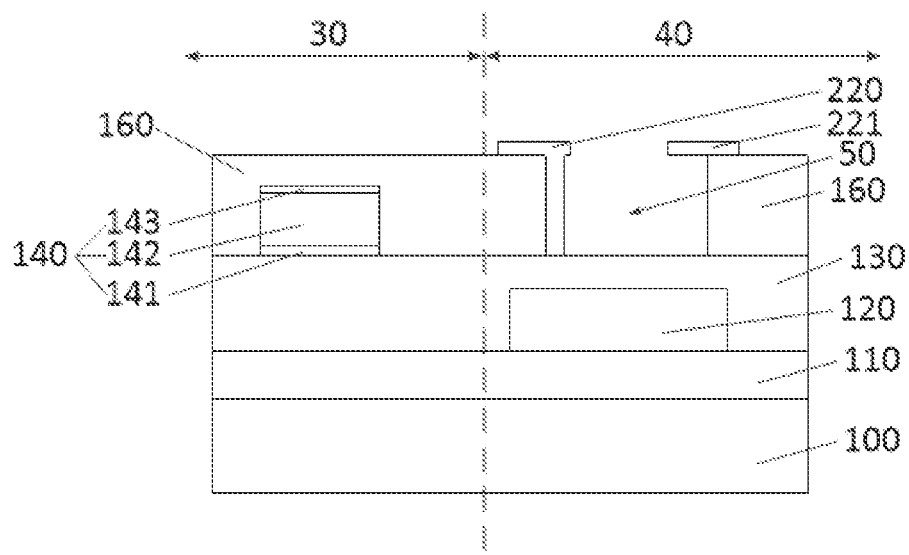
FIGS. 13 to 14 are partial schematic views showing the manufacture of the display panel according to one embodiment of the present disclosure.

In a possible embodiment of the present disclosure, S26 further includes S262 of removing the third auxiliary metal layer 222. The second auxiliary metal layer 221 protrudes from the side wall of the pixel definition layer 160 away from the display region 30 in the direction facing the display region, so as to form a structure as shown in FIG. 13.

In a possible embodiment of the present disclosure, the third auxiliary metal layer 222 is removed through a selective etching process, such as wet etching, so as to expose the side surfaces of the pixel definition layer 60 away from the display region 30.

Figure 14:
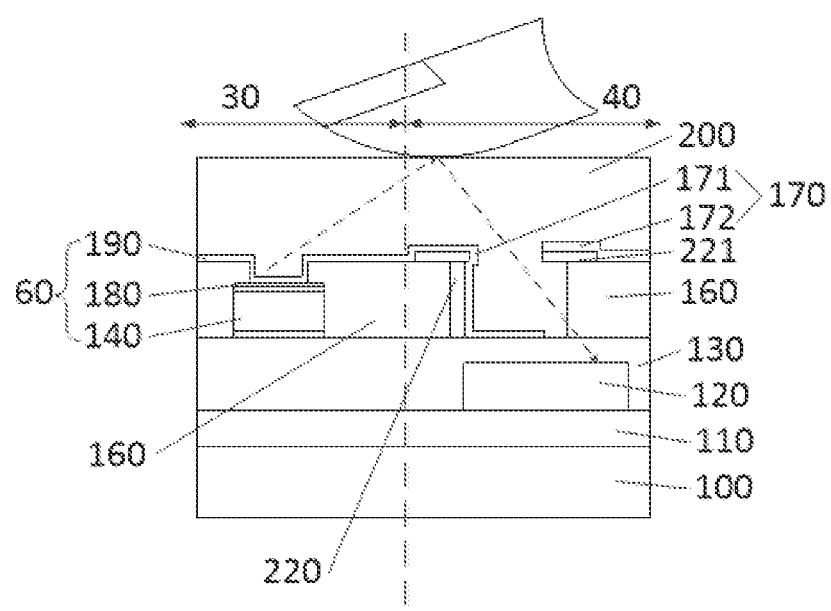

Through the above steps, a structure as shown in FIG. 14 is acquired.

In the embodiments of the present disclosure, even if the end of the first cathode metal layer 171 away from the display region is in contact with the pixel definition layer 160 away from the display region 30 due to the overflow of the cathode metal layer material during the formation of the cathode metal layer 170, the third auxiliary metal layer 222 is removed, and the visible light reflected by the finger directly enters the optical sensor 120 through the pixel definition layer 160 away from the display region 30, without any necessity to pass through the semitransparent cathode 190.

Through removing the third auxiliary metal layer 222, the visible light reflected by the finger is directly reflected to the optical sensor 120 through the pixel definition layer 160 away from the display region without passing through the semitransparent cathode 190. As a result, it is able to reduce the loss of the visible light, and increase the utilization rate of the visible light as well as the amount of the light received by the optical sensor 120, thereby to improve the sensitivity of the optical fingerprint identification.

The present disclosure further provides in some embodiments a display panel as shown in FIG. 14. Different from the optical fingerprint identification structure in FIG. 12, the optical fingerprint identification structure further includes an auxiliary metal layer formed in the sensing region opening 50. The auxiliary metal layer includes: a first auxiliary metal layer 220 located between the first cathode metal layer 171 and a side wall of the pixel definition layer 160 close to the display region, the first auxiliary metal layer 220 extending to the pixel definition layer 160 close to the display region; and a second auxiliary metal layer 221 located on the pixel definition layer away from the display region, the second cathode metal layer 172 extending to the second auxiliary metal layer 221. The second auxiliary metal layer 221 protrudes from the side wall of the pixel definition layer 160 away from the display region in a direction facing the display region, so that the first cathode metal layer 171 is separated from the second cathode metal layer 172 by a gap at the side wall of the pixel definition layer 160 away from the display region.

The present disclosure further provides in some embodiments a display device including the above-mentioned display panel. The display device is any product or member having a display function such as electronic paper, mobile phone, tablet computer, television, display, notebook computer, digital photo frame, or navigator, which will not be particularly defined herein.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display panel, comprising a plurality of optical fingerprint identification structures arranged in an array form, wherein each optical fingerprint identification structure comprises a display region and a sensing region, the display region comprises a driving circuitry layer, a planarization layer, a pixel definition layer and a light-emitting element laminated one on another on a substrate, and the light-emitting element comprises an anode, a light-emitting material layer and a cathode,
wherein the sensing region comprises:
a sensing region opening surrounded by the pixel definition layer, an orthogonal projection of the sensing region opening onto the substrate at least partially overlapping an orthogonal projection of the planarization layer onto the substrate;
an optical sensor arranged between the sensing region opening and the substrate; and
a cathode metal layer arranged in the sensing region opening,
wherein the cathode metal layer comprises a first cathode metal layer and a second cathode metal layer, the first cathode metal layer extends to the pixel definition layer close to the display region, the first cathode metal layer is coupled to the cathode, the second cathode metal layer extends to the pixel definition layer away from the display region, and the first cathode metal layer is separated from the second cathode metal layer by a gap so that light emitted by the light-emitting element is allowed to enter the optical sensor through the gap after being reflected by a fingerprint.

2. The display panel according to claim 1, wherein the optical fingerprint identification structure further comprises an anode layer provided in the sensing region opening and comprising a first anode layer, a second anode layer and a third anode layer laminated one on another in a direction away from the substrate, wherein the first anode layer is coupled to the first cathode metal layer, the second cathode metal layer extends to the third anode layer, and each of the first anode layer and the third anode layer protrudes from the second anode layer in a direction facing the display region so that the first cathode metal layer is separated from the second cathode metal layer at a side wall of the second anode layer facing the display region.

3. The display panel according to claim 2, wherein the anode is arranged at a same layer as the anode layer.

4. The display panel according to claim 3, wherein the anode comprises a first anode, a second anode and a third anode laminated one on another, the first anode layer is arranged at a same layer as the first anode, the second anode layer is arranged at a same layer as the second anode, and the third anode layer is arranged at a same layer as the third anode.

5. The display panel according to claim 1, wherein the optical fingerprint identification structure further comprises an auxiliary metal layer disposed in the sensing region opening, wherein the auxiliary metal layer comprises:
a first auxiliary metal layer arranged between the first cathode metal layer and a side wall of the pixel definition layer close to the display region and extending to the pixel definition layer close to the display region;
a second auxiliary metal layer arranged on the pixel definition layer away from the display region, the second cathode metal layer extending to the second auxiliary metal layer; and
a third auxiliary metal layer arranged on a side wall of the pixel definition layer far away from the display region,
wherein the second auxiliary metal layer protrudes from the third auxiliary metal layer in a direction facing the display region so that the first cathode metal layer is separated from the second cathode metal layer at a side wall of the third auxiliary metal layer facing the display region.

6. The display panel according to claim 1, wherein the optical fingerprint identification structure further comprises an auxiliary metal layer arranged in the sensing region opening, wherein the auxiliary metal layer comprises:
a first auxiliary metal layer arranged between the first cathode metal layer and a side wall of the pixel definition layer close to the display region and extending to the pixel definition layer close to the display region; and a second auxiliary metal layer arranged on the pixel definition layer away from the display region, the second cathode metal layer extending to the second auxiliary metal layer, wherein the second auxiliary metal layer protrudes from the side wall of the pixel definition layer away from the display region in a direction facing the display region so that the first cathode metal layer is separated from the second cathode metal layer at a side wall of the pixel definition layer away from the display region.

7. The display panel according to claim 1, wherein the cathode is arranged at a same layer as the cathode metal layer.

8. A method for manufacturing a display panel, the display panel comprising a plurality of optical fingerprint identification structures arranged in an array form, the method comprising:

forming a driving circuitry layer on a substrate; forming an optical sensor at a position corresponding to a sensing region of the optical fingerprint identification structure;

forming a planarization layer on the driving circuitry layer;

forming an anode on the planarization layer corresponding to a display region of the optical fingerprint identification structure, the anode being electrically coupled to the driving circuitry layer;

forming a pixel definition layer; forming an opening in the pixel definition layer at a position corresponding to the display region to expose the anode, and forming an opening in the pixel definition layer at a position corresponding to the sensing region to form a sensing region opening for exposing the planarization layer;

forming a light-emitting material layer on the anode; and forming a cathode covering the display region on the light-emitting material layer, and forming a cathode metal layer in the sensing region opening, wherein the cathode metal layer comprises a first cathode metal layer and a second cathode metal layer, the first cathode metal layer extends to the pixel definition layer close to the display region, the first cathode metal layer is coupled to the cathode, the second cathode metal layer extends to the pixel definition layer away from the display region, and the first cathode metal layer is separated from the second cathode metal layer by a gap so that the light emitted by the light-emitting element is allowed to enter the optical sensor through the gap after being reflected by a fingerprint.

9. The method according to claim 8, wherein when forming the anode on the planarization layer corresponding to the display region of the optical fingerprint identification structure, the method further comprises forming an anode layer on the planarization layer at a position corresponding to the sensing region, the anode layer comprising a first anode layer, a second anode layer and a third anode layer laminated one on another, wherein the forming the opening in the pixel definition layer at a position corresponding to the display region to expose the anode and forming the opening in the pixel definition layer at a position corresponding to the sensing region to form the sensing region opening for exposing the planarization layer comprises removing the pixel definition layer at a surface of the anode layer away from the planarization layer to expose the surface of the anode layer away from the planarization layer, removing the pixel definition layer at a side surface of the anode layer close to the display region to expose the side surface of the anode layer close to the display region, and removing a part of the second anode layer such that each of the first anode layer and the third anode layer protrudes from the second anode layer a direction facing the display region;

wherein the forming the cathode covering the display region on the light-emitting material layer and forming the cathode metal layer in the sensing region opening comprises depositing a cathode material to form the cathode and the cathode metal layer.

10. The method according to claim 8, wherein prior to forming the opening in the pixel definition layer at a position corresponding to the display region to expose the anode and forming the opening in the pixel definition layer at a position corresponding to the sensing region to form the sensing region opening for exposing the planarization layer, the method further comprises:

forming a first opening and a second opening in the pixel definition layer surrounding the sensing region opening, both the first opening and the second opening extending through the pixel definition layer to expose the planarization layer, the first opening being formed in the pixel definition layer close to the display region, and the second opening being formed in the pixel definition layer away from the display region; and forming a first auxiliary metal layer in the first opening, and forming a third auxiliary metal layer in the second opening, the first auxiliary metal layer extending to the pixel definition layer close to the display region, and the third auxiliary metal layer extending to the pixel definition layer away from the display region to form a second auxiliary metal layer, wherein the forming the opening in the pixel definition layer at a position corresponding to the display region to expose the anode and forming the opening in the pixel definition layer at a position corresponding to the sensing region to form the sensing region opening for exposing the planarization layer comprises removing the pixel definition layer between the first auxiliary metal layer and the third auxiliary metal layer to expose the planarization layer, the second auxiliary metal layer protruding from the third auxiliary metal layer in a direction facing the display region, wherein the forming the cathode covering the display region on the light-emitting material layer and forming the cathode metal layer in the sensing region opening comprises depositing a cathode material to form the cathode and the cathode metal layer.

11. The method according to claim 8, wherein prior to forming the opening in the pixel definition layer at a position corresponding to the display region to expose the anode and forming the opening in the pixel definition layer at a position corresponding to the sensing region to form the sensing region opening for exposing the planarization layer, the method further comprises:

forming a first opening and a second opening in the pixel definition layer surrounding the sensing region opening, both the first opening and the second opening extending through the pixel definition layer to expose the planarization layer, the first opening being formed in the pixel definition layer close to the display region, and the second opening being formed in the pixel definition layer away from the display region; and forming a first auxiliary metal layer in the first opening, and forming a third auxiliary metal layer in the second opening, the first auxiliary metal layer extending to the pixel definition layer close to the display region, the first auxiliary metal layer being electrically coupled to the cathode, and the third auxiliary metal layer extending to the pixel definition layer away from the display region to form a second auxiliary metal layer, wherein the forming the opening in the pixel definition layer at a position corresponding to the display region to expose the anode and forming the opening in the pixel definition layer at a position corresponding to the sensing region to form the sensing region opening for exposing the planarization layer comprises:

removing the pixel definition layer between the first auxiliary metal layer and the third auxiliary metal layer to expose the planarization layer; and removing the third auxiliary metal layer, the second auxiliary metal layer protruding from the side wall of the pixel definition layer away from the display region in a direction facing the display region, wherein the forming the cathode covering the display region on the light-emitting material layer and forming the cathode metal layer in the sensing region opening comprises depositing a cathode material to form the cathode and the cathode metal layer.

12. A display device, comprising the display panel according to claim 1.

* * * * *